United States Patent [19]

Bilharz

[11] Patent Number: 4,599,703
[45] Date of Patent: Jul. 8, 1986

[54] LOW FREQUENCY AC WAVEFORM GENERATOR

[75] Inventor: Oscar W. Bilharz, Scotia, N.Y.

[73] Assignee: The United States of America as represented by the United States Department of Energy, Washington, D.C.

[21] Appl. No.: 554,413

[22] Filed: Nov. 22, 1983

[51] Int. Cl.$^4$ .............................................. G06G 7/26
[52] U.S. Cl. ................... 364/851; 364/817; 364/858; 328/14
[58] Field of Search ........ 364/602, 607, 718, 721–722, 364/729, 807, 817, 851, 857–858; 328/13–14, 22

[56] References Cited

U.S. PATENT DOCUMENTS

| | | | |
|---|---|---|---|
| 2,852,191 | 9/1958 | Lazarus | 235/61 |
| 3,006,551 | 10/1961 | Newell et al. | 235/186 |
| 3,320,411 | 5/1967 | Martinez | 235/197 |
| 3,340,476 | 9/1967 | Thomas et al. | 328/14 X |
| 3,543,288 | 11/1970 | Collings | 364/858 X |
| 3,649,845 | 3/1972 | Foch | 364/858 X |
| 3,688,098 | 8/1972 | Cwynar et al. | 235/197 |
| 3,689,914 | 9/1972 | Butler | 328/14 X |
| 3,697,877 | 10/1972 | Godfrey | 328/13 |
| 3,982,189 | 9/1976 | Brooks et al. | 328/22 X |
| 4,415,860 | 11/1983 | Lo | 328/22 |

Primary Examiner—Gary V. Harkcom
Attorney, Agent, or Firm—Judson R. Hightower; Richard E. Constant

[57] ABSTRACT

Low frequency sine, cosine, triangle and square waves are synthesized in circuitry which allows variation in the waveform amplitude and frequency while exhibiting good stability and without requiring significant stabilization time. A triangle waveform is formed by a ramped integration process controlled by a saturation amplifier circuit which produces the necessary hysteresis for the triangle waveform. The output of the saturation circuit is tapped to produce the square waveform. The sine waveform is synthesized by taking the absolute value of the triangular waveform, raising this absolute value to a predetermined power, multiplying the raised absolute value of the triangle wave with the triangle wave itself and properly scaling the resultant waveform and subtracting it from the triangular waveform itself. The cosine is synthesized by squaring the triangular waveform, raising the triangular waveform to a predetermined power and adding the squared waveform raised to the predetermined power with a DC reference and subtracting the squared waveform therefrom, with all waveforms properly scaled. The resultant waveform is then multiplied with a square wave in order to correct the polarity and produce the resultant cosine waveform.

31 Claims, 7 Drawing Figures

LOW FREQUENCY AC WAVEFORM GENERATOR

The United States Government has rights in this invention pursuant to Contract No. EY-76-C-12-0052 between the U.S. Department of Energy and General Electric Corporation.

FIELD OF THE INVENTION

This invention relates to an apparatus for generating AC waveforms, particularly at very low frequencies. More particularly, the present invention relates to an apparatus for synthesizing sine and cosine waveforms at extremely low frequencies.

BACKGROUND OF THE INVENTION

A stable and adjustable source of extremely low frequency waveforms has been needed in the past for the testing and development of various electronic components such as amplifiers, filters, spectrum analyzers and the like. Recent interest in amplifier a filter circuits having known and specified response characteristics down to very low frequencies in the region of 0.01 Hz and below have resulted in the need for a highly stable signal source of such frequencies variable both in frequency and amplitude.

Conventional oscillatory circuits of the LC or RC type (e.g., Wien Bridge circuits) utilize AC feed-back to maintain oscillation and DC feedback from an averaged output for output amplitude stabilization. Therefore, several cycles are necessary for frequency stabilization and many cycles are required for amplitude stabilization whenever an operational change is made. While such oscillators have been constructed to operate at frequencies below 0.01 Hz, the stabilization waiting times become very long and generally impractical. At these very low frequencies, waveform synthesis becomes a more practical solution for a signal source. Digital sine and cosine synthesis techniques have been used in the past for this purpose, but at the present time are undesirably expensive. Therefore, a need has developed for a more inexpensive AC waveform synthesis technique which inexpensively produces a stable waveform.

SUMMARY OF THE INVENTION

Accordingly, it is an object of the present invention to provide a new and novel method and apparatus for the analog synthesis of AC waveforms, particularly at very low frequencies.

It is another object of the present invention to provide a device for analog synthesis for AC waveforms at these very low frequencies which produces a waveform which is stable with regard to changes in frequency and amplitude.

It is a further object of the present invention to synthesize the above-mentioned waveforms from easily generated square and triangle waveforms.

It is still a further object of the present invention to produce analog synthesized sine and cosine waveforms which exhibit low harmonic content, and are stable in amplitude, frequency and phase relationship.

These and other objects of the present invention will become more fully apparent with reference to the following specification and drawings which relate to the preferred embodiments of the present invention.

The present invention generates a triangle waveform through the use of an integrator which cycles between fixed levels of, for example, $-10$ V and $+10$ V. The cycling rate, or frequency, is determined by control of the integrator ramp rate by control of the input to an integrator RC circuit. The integrator RC circuit is cycled to produce a triangle waveform.

A level switch comprising two zener diodes in series opposition reverses the integrator ramp and also inherently produces a square wave which is inverted and adjusted in amplitude to produce a square wave output $E_{Sq}$.

A sine synthesizer circuit receives the triangle waveform $E_T$ which is representative of $\theta$ between $-\pi/2$ and $+\pi/2$ and converts this triangle waveform $E_T$ into a sinewave according to the following formula:

$$E_S = E_T[1 - 0.1585(|E_T|)^{1.837}] \text{ volts} \tag{1}$$

where $E_T$ is the voltage of the triangle waveform and $E_S$ is the voltage of the sine waveform.

The sine synthesis circuit uses an absolute value circuit which is actually a precision rectifier circuit to produce the absolute value of the triangular input wave. An exponential operator module is then used to raise the absolute value of this triangle waveform to the power of 1.837. This value is then multiplied by the triangle waveform, scaled by the desired factor of 0.1585 and subtracted from the triangle waveform in order to produce a sine waveform which, in the preferred embodiment, is accurate to less than 0.5 percent of the signal value.

The triangle waveform and square waveform are applied to a cosine synthesizer circuit which synthesizes the cosine from these respective waveforms according to the following formula:

$$E_C = 1 - (E_T)^2/2 + 0.00403[(E_T)^2]^{1.946} \text{ volts} \tag{2}$$

where $E_T$ is the voltage of the triangle waveform, and $E_C$ is the voltage of the sine waveform.

This formula and the circuitry implementing it in actuality produce a synthesis of the cosine wave only during the positive halfcycle. Instead of producing a negative halfcycle, the positive halfcycle is repeated. Thus, in order to form a correct cosine waveform, the waveform generated by equation 2 must be multiplied with a square wave $-E_{Sq}$ generated by the triangle and square wave generator. A synthesized cosine waveform which is accurate to greater than 0.5 percent of peak value is thereby created.

The cosine synthesizer circuit utilizes a multiplier to square the triangle waveform $E_T$. This waveform is then applied to an exponential operator module which raises the squared triangle waveform to the power of 1.946. A summing circuit is then used to add a 10 volt signal to the scaled output of the exponential operator module and subtract from the summed value the scaled output of the multiplier $E_T^2$. This produces a value as shown in equation 2 which is multiplied with the square wave $-E_{Sq}$ to produce the finished synthesized cosine waveform.

Thus, the device of the present invention produces synthesized sine, cosine, square and triangular waveforms which may be operated down to a cycling rate of as low as 1 cycle per day.

BRIEF DESCRIPTION OF THE DRAWINGS

The features of the present invention will become more fully apparent by reference to the attached drawings, wherein.

PREFERRED EMBODIMENT OF THE PRESENT INVENTION

Figure 1:
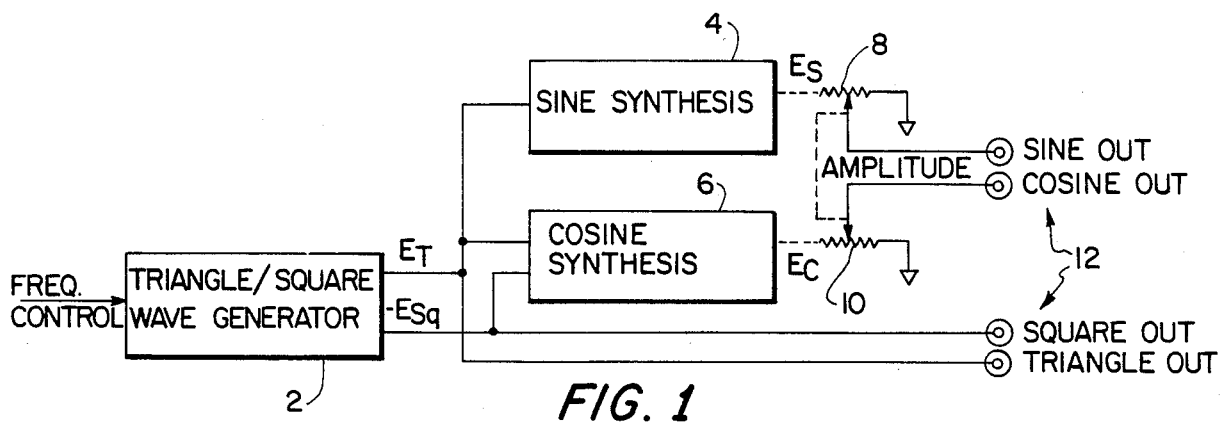
FIG. 1 is a block diagram of the system as a whole showing the interconnection on the triangle/ square wave generator with the sine synthesis circuit and cosine synthesis circuit.
Figure 4:
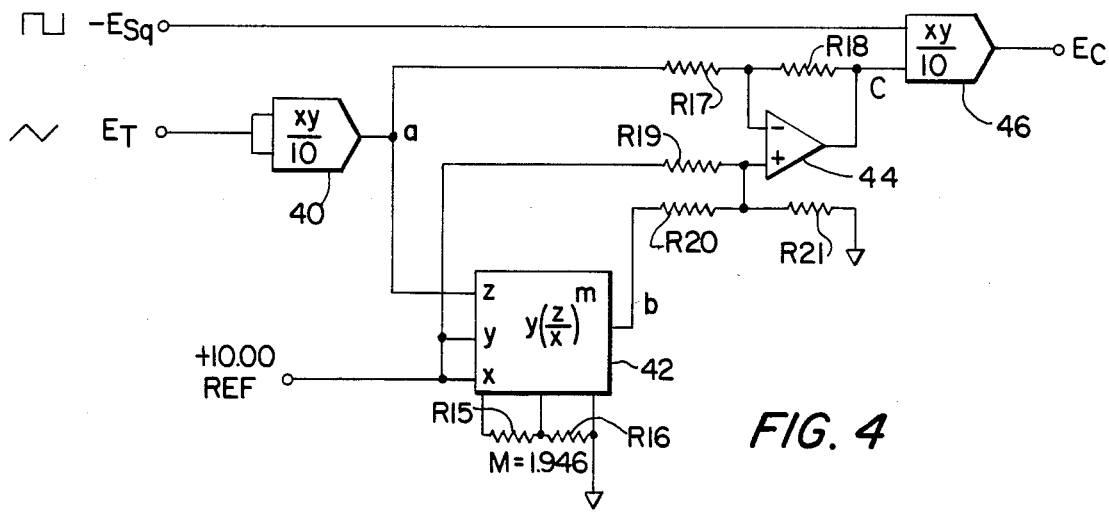
FIG. 4 is a circuit diagram of the cosine synthesis circuit shown in FIG. 1.

FIG. 1 is an overall block diagram of the circuitry of the present application. A triangle/ square wave generator 2 generates a triangle waveform $E_T$ and a square waveform $-E_{Sq}$. A sine synthesis circuit 4 receives the triangle waveform $E_T$ and uses this triangle waveform $E_T$ to synthesize a sine waveform $E_S$. A cosine synthesis circuit 6 receives the triangle waveform $E_T$ and the square waveform $-E_{Sq}$ and uses these waveforms to synthesize a cosine waveform $E_C$. A sine potentiometer 8 has one terminal connected to the sine synthesis circuit 4 and one terminal connected to circuit ground. The center tap of the sine potentiometer 8 is connected to a sine out terminal of the generator which is part of an output terminal array 12. Similarly, a cosine potentiometer has a first terminal connected to the cosine synthesis circuit 6 and a second terminal connected to circuit ground while the center tap of the cosine potentiometer 10 supplies a signal to a cosine out terminal of the generator which is part of the output terminal array 12. By varying the respective positions of the center taps of the sine and cosine potentiometers 8, 10, the amplitude of the outputs of the sine synthesis circuit 4 and cosine synthesis circuit 6 may be varied. Thus, the present invention, as illustrated in FIG. 4, produces sine, cosine, square and triangle output waveforms at the output terminal array 12.

Figure 2:
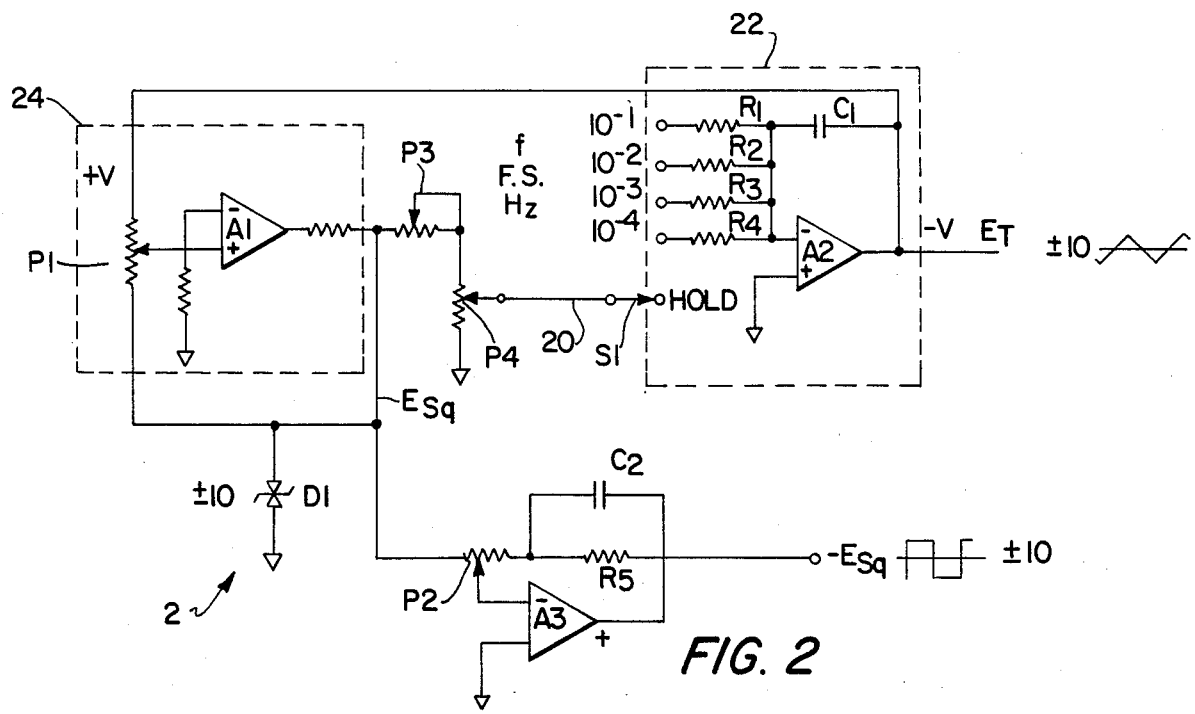
FIG. 2 is a circuit diagram of the triangle and square wave generator shown in FIG. 1.

FIG. 2 illustrates a circuit diagram of the triangle and square wave generator 2 of FIG. 1. An integrating operational amplifier A2 of FIG. 1 operates, in conjunction with a capacitor C1 and resistor array R1-R4 as an integrator 22. The output of the integrator 22 is applied to a saturation circuit 24 including a saturation operational amplifier A1. The saturation operational amplifier A1 has its negative terminal clamped to ground while its positive terminal is connected to the center tap of the potentiometer P1. The main taps of the potentiometer are connected between the output of the saturation operational amplifier A1 and the integrator operational amplifier A2. A pair of zener diodes D1 connected in series opposition are used to hold the voltage applied to the potentiometer P1 from the output of the saturation operational amplifier A1 to 10 volts. The output of the saturation operational amplifier A1 is connected to the resistor array R1-R4 via a calibration potentiometer P3, a frequency adjustment potentiometer P4, line 20 and a frequency range switch S1. The output of the saturation amplifier A1 is further connected to an inverting amplifier A3 which uses a resistor R5 in conjunction with a potentiometer P2 to set the square wave output amplitude. A capacitor C2 is connected in parallel with the resistor R5 in order to slightly dampen the square wave output in order to reduce zero cross-over glitch in the cosine circuit. This dampening capacitor is relatively small, on the order of $10^{-1}$ M$_F$D.

The triangle and square wave generator circuit 2 functions as follows. Assuming the output of the saturation amplifier A1 is at positive saturation, a 10 V signal is produced at the output of this amplifer A1. This signal is attenuated by the frequency calibration potentiometer P3 and frequency adjustment potentiometer P4 and applied via switch S1 to a respective resistor R1-R4 of the resistor array. As can be seen in FIG. 2, the resistors R1-R4 vary between each other by powers of 10 in order to, as the resistance of the respective resistor increases, correspondingly reduce the frequency of the triangle wave to be generated by a power of 10. The resistor selected within the resistor array R1-R4 by the frequency range switch S1 operates in conjunction with capacitor C1 and the integrator operational amplifier A2 as an integrator and produces a voltage which, because the negative input of the integrator amplifier A2 is used, decreases with time. At the point the output voltage of the integrator operational amplifier A2 is zero, the voltage applied to the center tap of potentiometer P1 is equal to one-half the 10 V threshold of the series opposed zener diodes D1. As the voltage at the output of the integrator operational amplifier A2 decreases and approaches 10V, the voltage at the center tap of the potentiometer P1 decreases to zero.

When the output voltage of the integrator operational amplifier A2 reaches $-10$ V, the voltage seen by the center tap of the potentiometer P1 goes negative, thereby causing the output of the saturation operational amplifer A1 to go negative. Again, this negative voltage is clamped by the series opposed zener diodes D1 to $-10$ V. This $-10$ V signal is attenuated by potentiometers P3, P4 and a respective one of resistors R1-R4 which, in cooperation with the capacitor C1 and integrator operational amplifer A2, begins to increase the output of the operational amplifier A2 and, thus, increase the voltage applied to the center tap of the potentiometer P1. When this voltage reaches $+10$ V, the voltage seen by the center tap of the potentiometer will again go positive, thereby initiating the reduction in the output of the integrator operational amplifier A2. Thus, it can be seen that a triangular waveform develops from the circuit as shown as waveform (c) of FIG. 5.

Figure 5:
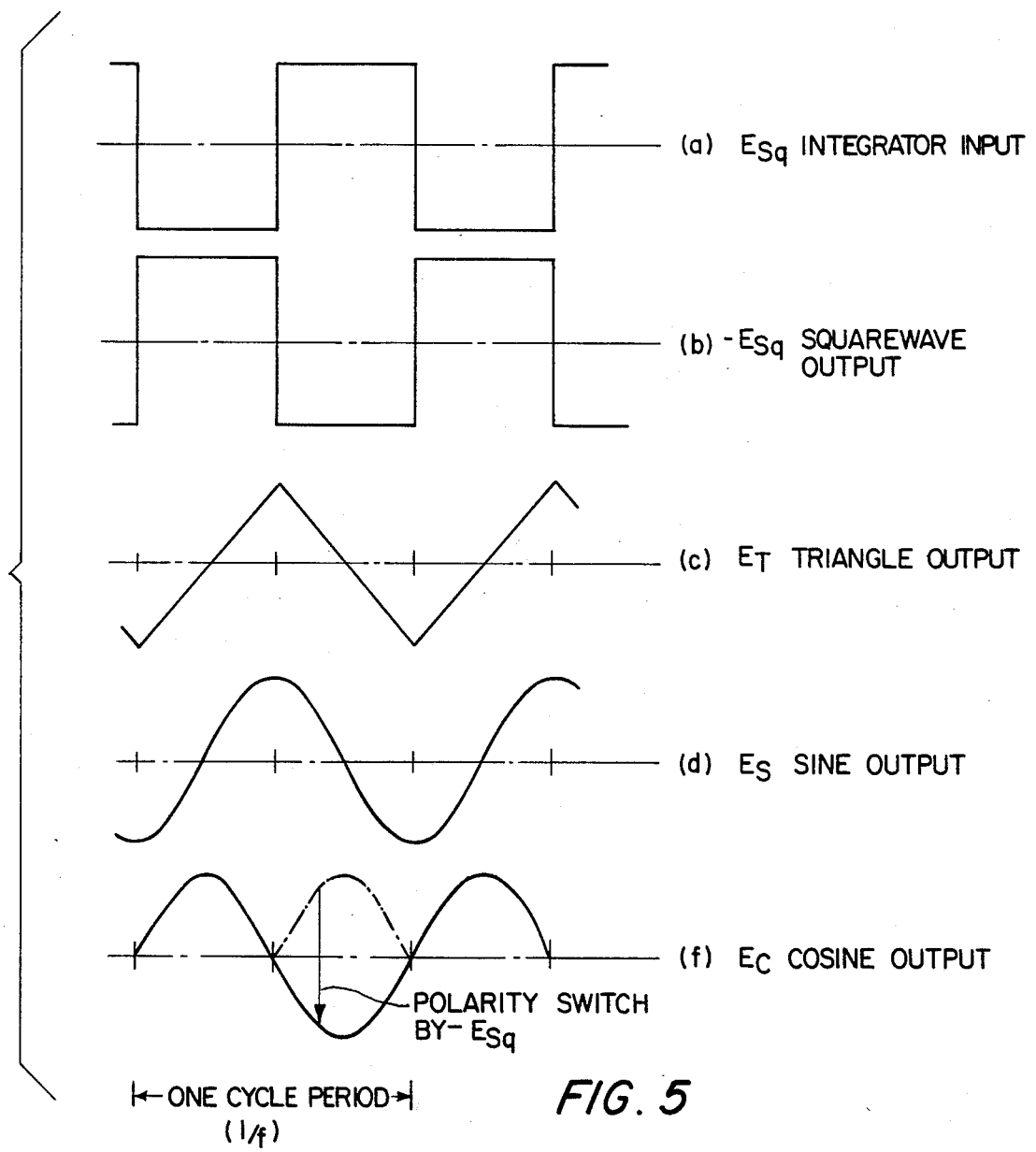
FIG. 5 is a waveform diagram illustrating the relationship between the square waveforms, triangle waveform and sine and cosine waveforms.

The output of the saturation operational amplifier A1 clamped by the series opposed zener diodes D1 is a square wave signal as shown in waveform (a) of FIG. 5. In order to produce the desired square wave output, this saturation amplifier output $E_{Sq}$ must be inverted to produce the $-E_{Sq}$ waveform (b) of FIG. 5. This is accomplished by the inverting amplifier A3 in conjunction with potentiometer P2 and resistor R5. Capacitor C2 inserts a dampening time constant into the output of inverting amplifier A-3 in order to reduce zero crossover glitch within the cosine synthesis circuit 6.

Figure 3:
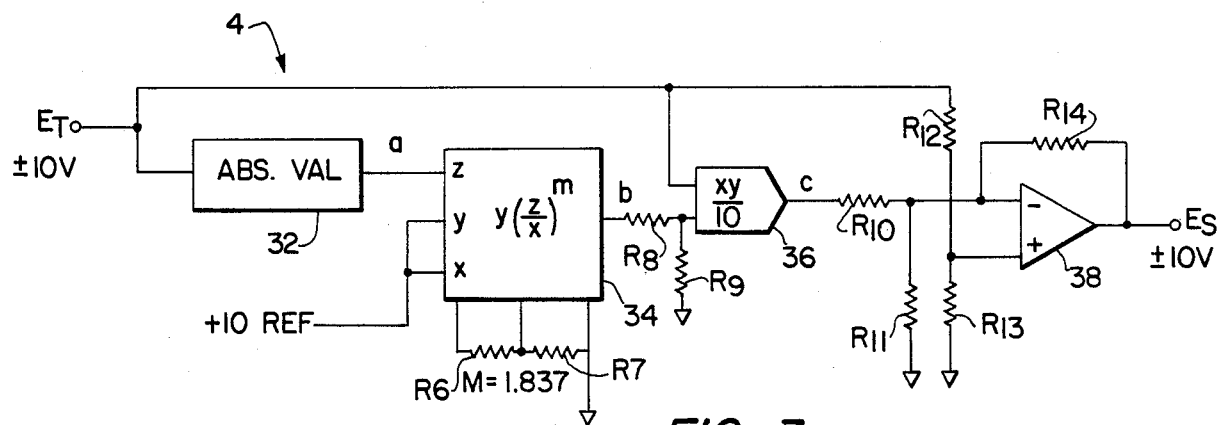
FIG. 3 is a circuit diagram of the sine synthesis circuit of FIG. 1.

Referring to FIG. 3, the sine synthesis circuit 4 of FIG. 1 is illustrated in greater detail. The triangular waveform produced by the triangle-square wave generator 2 is applied to the input of an absolute value circuit 32 of a type known in the art.

This absolute value circuit 32 used in the preferred embodiment of the present application is a precision full wave rectifier constructed with operational amplifiers as is well known in the art. The absolute value circuit 32 produces at its output the absolute value of the input triangle waveform $|E_T|$ at point A. This signal A is applied to the input of an exponential operator circuit 34. While any suitable exponential operator circuit may be used, a Model 4302 multifunction converter manufactured by Burr-Brown Research Corporation is utilized in the preferred embodiment. In this Model 4302 circuit, the proper ratioing of resistors R6, R7 produces the desired power factor, which, in the preferred embodiment, is 1.837. The output of the exponential operation circuit is a signal appearing at point B which is equal to $K(|E_T|)^{1.837}$.

This signal appearing at point B is scaled by resistors R8, R9 and applied to a multiplier circuit 36 along with the triangle waveform $E_T$. Any suitable circuit may be used for the multiplier 36. In the preferred embodiment, a Model 4206 analog multiplier-divider manufactured by Burr-Brown Research Corporation is utilized. The output of this multiplier at point C is equal to $K\,E_T(|E_T|)^{1.837}$. This signal c is then applied to the non-inverting input of summing oeprational amplifier 38 via scaling resistors R10, R11 along with the triangle waveform $E_T$ which is applied to the summing operational amplifier 38 via scaling resistors R12, R13 to form the output $E_S$. Resistor R14 stabilizes the summing operational amplifier 38 and is sized to match the resistance of resistor R13.

FIG. 4 is a block diagram of the cosine synthesis circuit. A cosine triangle waveform multiplier circuit 40 receives the triangle waveform produced by the triangle/ square wave generator 2 and multiplies it with itself to produce a signal at point A of this figure proportional to $(E_T)^2$. This signal is applied to a cosine exponential operator circuit 42 which raises the signal at point A to the power of M. This exponential operator circuit 42 is also, in the preferred embodiment, a Burr-Brown Model 4302 multifunction converter. The power M to which the signal A is raised is determined by selection of resistors R15, R16. In the preferred embodiment, M is 1.946. Thus, the signal at point B of FIG. 4 is proportional to $(E_T^2)^{1.946}$. A cosine summing operational amplifier 44 receives the signal $(E_T)^{1.946}$ through scaling resistors R20, R21. The cosine summing operational amplifier 44 further receives a DC reference voltage through scaling resistors R19, R21 and sums this with the signal B received from the cosine exponential operator circuit 34. The negative terminal of the summing operational amplifier 44 receives the signal A or $E_T^2$ through a resistor R17 which, in conjunction with a resistor R18, controls the gain of the summing operational amplifier 44. Thus, the waveform at the output of the summing operational amplifier 44, point C, is is a sealed version of equation 2.

While the signal at point C is equal to the cosine of the angle $\theta$ applied as triangular waveform $E_T$, the signal at point C produces only the positive half of the cosine waveform. In order to produce the proper polarity in negative half cycles, the equation 2 is multiplied by the square wave $-E_{Sq}$ in a multiplier circuit 46 to produce the finished cosine waveform $E_C$. Referring to FIG. 5, the square wave $-E_{Sq}$ shown as waveform B is multiplied with the waveform at point C which is represented by the positive pulse shown in dashed lines. This multiplication inverts the polarity of alternate positive pulses to produce a proper cosine wave as shown in waveform F of FIG. 5.

In operation, the triangle and square wave generator produces a triangular waveform and square waveform as previously discussed. The triangular waveform is applied to the input of the sine synthesis circuit 4 where the absolute value of the sine waveform is taken to produce a signal at point A proportional to $|E_T|$. This signal is raised to the power of 1.837 to form a signal at point B equal to $(|E_T|)^{1.837}$. This signal B is then multiplied with $E_T$ representative of the angle $\theta$ to produce a signal at point C proportional to $E_T \cdot (|E_T|)^{1.837}$. This signal C is applied to the summing operational amplifier 38 through scaling resistors R10, R11. Simultaneously, the signal $E_T$ is applied to the positive terminal of this operational amplifier to produce a net output $E_S$, the synthesized sine waveform.

Figure 6A:
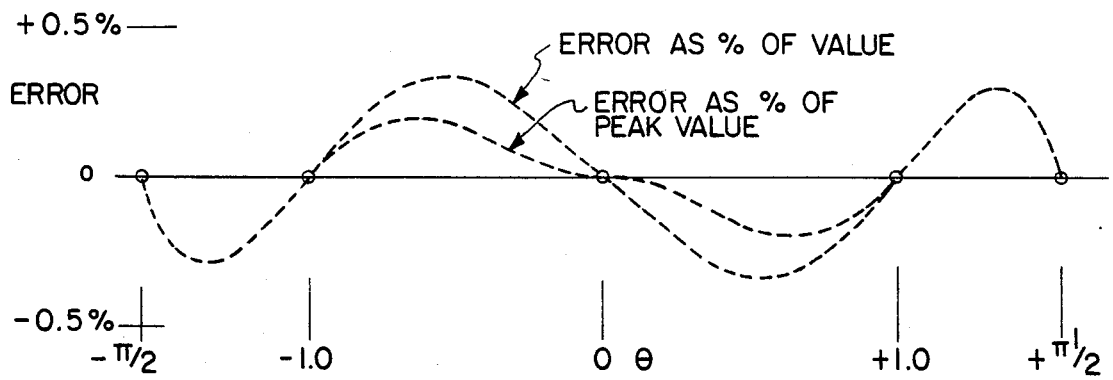
FIGS. 6A and 6B are graphs illustrating the synthesis error of the function of angle in radians.
Figure 6B:
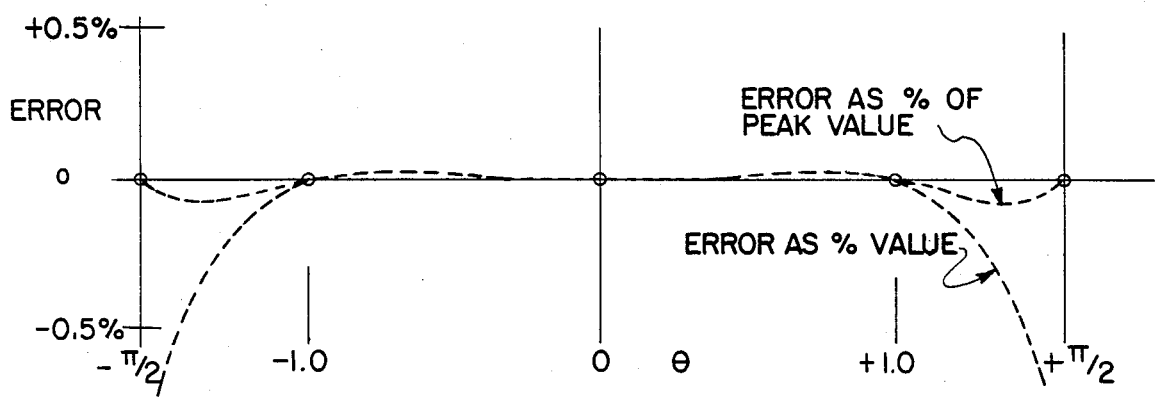

The cosine synthesis circuit receives the triangle waveform from the triangle/square wave generator 2 and squares this waveform in the cosine triangle waveform multiplier circuit 40 to produce a signal at point A proportional to $E_T^2$. This signal is then applied to the cosine exponential operator circuit 42 which raises this signal at point A to the power of 1.946 to produce a signal B at its output proportional to $(E_T^2)^{1.946}$. This signal is then summed with a DC reference voltage via the resistor network including resistors R19–R21 arranged at the input of the summing operational amplifier 44. Simultaneously, signal A proportional to the triangle waveform squared is applied to the negative input of the summing operational amplifier 44 to subtract this signal from the sum of the reference DC voltage and signal B. This produces a signal corresponding to the waveform shown in equation 2 which is then multiplied with the square wave $-E_{Sq}$ to produce a finished synthesized cosine waveform (F) of FIG. 5. The above-mentioned circuits produce synthesized sine and cosine waveforms with great accuracy. FIGS. 6A and 6B graph the waveform error, both as a percentage of peak value and actual value, of each of these waveforms in relation to radian angle. From these graphs, it can be seen that the synthesis circuits of the present invention produce highly accurate representations of sine and cosine waveforms which are relatively independent of frequency. These synthesized waveforms exhibit good stability, do not require significant stabilization time and are variable, both in frequency and amplitude. It should be understood that the present invention's method and apparatus of constructing synthesized waveforms at relatively low frequencies may be modified as it occurs to one of ordinary skill in the art without departing from the spirit and scope of the present invention.

What is claimed is:

1. A circuit for synthesizing the sine of an angle from a first signal representative of the angle comprising:

input means receiving said first signal;

absolute value determination means connected to said input means for producing a second signal having a voltage equal to the absolute value of the voltage of said first signal;

exponential circuit means responsive to said second signal for producing a third signal having a voltage related to the voltage of said second signal by a predetermined power;

multiplication circuit means responsive to said first and third signals for producing a fourth signal having a voltage proportional to the product of the voltages of said first and third signals; and summer circuit means responsive to said first and fourth signals for subtracting the voltage of said fourth signal from the voltage of said first signal to produce an output signal having a voltage indicative of the sine of the voltage of said first signal.

2. The circuit of claim 1, wherein said first signal is a triangle waveform oscillating between voltages representative of $-\pi/2$ to $\pi/2$ radians; and wherein said output signal is a sinewave.

3. The circuit of claim 2, wherein said sinewave has a period equal to that of said triangle waveform.

4. The circuit of claim 3, wherein said predetermined power is 1.837; and wherein the voltage $E_S$ of said sinewave is related to the voltage $E_T$ of said triangle waveform as follows:

$$E_S = E_T[1.57 - 0.008295(|E_T|)1.837] \text{ volts.}$$

5. The circuit of claim 1 wherein first signal is developed by triangle waveform generation means for developing a triangle waveform having a voltage which periodically varies linearly from a minimum voltage representing the radian angle $-\pi/2$ to a maximum voltage representing a radian angle of $\pi/2$.

6. The circuit of claim 5 wherein said triangle waveform generator means comprises:

means for integrating a reference voltage to develop a ramp signal;

level switch means responsive to the value of said ramp signal for reversing the polarity of said reference voltage to reverse the direction of integration performed by said means for integrating;

said means for integrating thereby developing said ramp waveform into said first signal of a triangle waveform.

7. The circuit of claim 6 wherein said reference voltage is reversed in polarity by said level switch means to develop a square wave having a period equal that of said first signal of a triangle waveform.

8. A circuit for synthesizing the cosine of an angle from a first signal of a voltage representative of the angle comprising:

input means receiving said first signal;

square circuit means operatively connected to said input means for producing a second signal having a voltage proportional to the square of the voltage of said first signal;

exponential circuit means responsive to said second signal for producing a third signal having a voltage related to a predetermined power of the voltage of said second signal;

summer circuit means responsive to said second and third signals for adding the third signal and for subtracting a voltage proportional to the voltage of said second signal therefrom to produce a fourth signal; and means for polarity compensating the voltage of said fourth signal to produce an output signal having a voltage indicative of the cosine of the voltage of said first signal.

9. The circuit of claim 8, wherein said means for polarity compensating multiplies said fourth signal with a compensating signal having a polarity the same as that of said first signal.

10. The circuit of claim 9, wherein said compensating signal has a constant voltage magnitude.

11. The circuit of claim 9, wherein said first signal is a triangle waveform, said compensating signal is a square wave and said output signal is a cosine wave.

12. The circuit of claim 8, wherein said first signal is a triangle waveform and said output signal is a cosine wave.

13. The circuit of claim 12, wherein said triangle waveform oscillates between $-\pi/2$ and $\pi/2$ radians.

14. The circuit of claim 13, wherein said cosine wave has a period equal to that of said triangle waveform.

15. The circuit of claim 14, wherein said predetermined power is 1.946; and wherein the voltage $E_C$ of said cosine wave is related to the voltage $E_T$ of said triangle waveform as follows:

$$E_C = 10 - 0.1234\,(E_T)^2 + 0.0002996[(E_T)^2]^{1.946} \text{ volts.}$$

16. The circuit of claim 8 wherein first signal is developed by triangle waveform generation means for developing a triangle waveform having a voltage which periodically varies linearly from a minimum voltage representing the radian angle $-\pi/2$ to a maximum voltage representing a radian angle of $\pi/2$.

17. The circuit of claim 16 wherein said triangle waveform generator means comprises:

means for integrating a reference voltage to develop a ramp signal;

level switch means responsive to the value of said ramp signal for reversing the polarity of said reference voltage to reverse the direction of integration performed by said means for integrating;

said means for integrating thereby developing said ramp waveform into said first signal of a triangle waveform.

18. The circuit of claim 17 wherein said reference voltage is reversed in polarity by said level switch means to develop a square wave having a period equal that of said first signal of a triangle waveform.

19. The circuit of claim 18 wherein said square wave is supplied to said means for polarity compensating as a compensation signal.

20. A method of synthesizing the sine of an angle a first signal of a voltage representative of the angle comprising:

receiving said first signal;

producing a second signal having a voltage equal to the absolute value of the voltage of said first signal;

providing a third signal having a voltage related to the voltage of said second signal by a predetermined power;

producing a fourth signal having a voltage proportional to the product of the voltages of said first and third signals; and subtracting the voltage of said fourth signal from the voltage of said first signal to produce an output signal having a voltage indicative of the sine of the voltage of said first signal.

21. The method of claim 20, wherein said first signal is a triangle waveform oscillating between voltages representative of $-\pi/2$ to $\pi/2$ radians; and wherein said output signal is a sinewave.

22. The method of claim 21, wherein said sinewave has a period equal to that of said triangle waveform.

23. The circuit of claim 22, wherein said predetermined power is 1.837; and wherein the voltage $E_S$ of said sinewave is related to the voltage $E_T$ of said triangle waveform as follows:

$$E_S = E_T[1.57 - 0.008295\,(|E_T|)1.837] \text{ volts.}$$

24. A method of synthesizing the cosine of an angle from a first signal of a voltage representative of the angle comprising:
receiving said first signal;
producing a second signal having a voltage proportional to the square of the voltage of said first signal;
producing a third signal having a voltage related to the voltage of said second signal by a predetermined power;
producing a fourth signal by adding a voltage proportional to the voltage of said third signal and to a constant voltage and subtracting a voltage proportional to the voltage of said second signal therefrom; and
converting the polarity of portions of said fourth signal to produce an output signal having a voltage indicative of the cosine of the voltage of said first signal.

25. The method of claim 24, wherein said step of converting the polarity multiples said fourth signal with a compensating signal having a polarity the same as that of said first signal.

26. The method of claim 25, wherein said compensating signal has a constant voltage magnitude.

27. The method of claim 25, wherein said first signal is a triangle waveform, said compensating signal is a square wave and said output signal is a cosine wave.

28. The method of claim 24, wherein said first signal is a triangle waveform and said output signal is a cosine wave.

29. The method of claim 28, wherein said triangle waveform oscillates between $-\pi/2$ and $\pi/2$ radians.

30. The method of claim 29, wherein said cosine wave has a period equal to that of said triangle waveform.

31. The method of claim 30, wherein said predetermined power is 1.946; and
wherein the voltage $E_C$ of said cosine wave is related to the voltage $E_T$ of said triangle waveform as follows:

$$E_C = 10 - 0.1234(E_T)^2 + 0.0002996[(E_T)^2]^{1.946} \text{ volts.}$$

* * * * *